United States Patent
Masui et al.

(10) Patent No.: US 11,127,887 B2
(45) Date of Patent: Sep. 21, 2021

(54) SEMICONDUCTOR LIGHT EMITTING DEVICE WITH REFLECTIVE SIDE COATING

(71) Applicant: Lumileds LLC, San Jose, CA (US)

(72) Inventors: Hisashi Masui, San Jose, CA (US); Oleg B. Shchekin, San Francisco, CA (US); Ken Shimizu, Sunnyvale, CA (US); Lex Kosowsky, San Jose, CA (US); Ken Davis, Raleigh, NC (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/750,144

(22) PCT Filed: Jul. 13, 2016

(86) PCT No.: PCT/US2016/042025
§ 371 (c)(1),
(2) Date: Feb. 2, 2018

(87) PCT Pub. No.: WO2017/023502
PCT Pub. Date: Feb. 9, 2017

(65) Prior Publication Data
US 2018/0226543 A1 Aug. 9, 2018

Related U.S. Application Data

(60) Provisional application No. 62/200,490, filed on Aug. 3, 2015.

(51) Int. Cl.
*H01L 33/46* (2010.01)
*H01L 33/00* (2010.01)
*H01L 33/20* (2010.01)
(Continued)

(52) U.S. Cl.
CPC .......... *H01L 33/46* (2013.01); *H01L 33/0095* (2013.01); *H01L 33/20* (2013.01);
(Continued)

(58) Field of Classification Search
CPC ..... H01L 33/0095; H01L 33/20; H01L 33/46; H01L 33/486; H01L 33/505; H01L 33/56; H01L 2933/0025; H01L 2933/0058
See application file for complete search history.

(56) References Cited

U.S. PATENT DOCUMENTS 7,825,575 B2   11/2010   Sawanobori et al.
8,957,428 B2   2/2015    Jagt et al.
(Continued)

FOREIGN PATENT DOCUMENTS

CN   104676320 A   6/2015
EP   2816617       12/2014
(Continued)

OTHER PUBLICATIONS

From the EPO as the ISA, Notification of Transmittal of the International Search Report and the Written Opinion of the International Searching Authority, corresponding to PCT/US2016/042025, dated Oct. 10, 2016, 15 pages.

*Primary Examiner* — Thanh Y. Tran (57) ABSTRACT

A semiconductor light emitting device (100;200;300;400,400B,400C;500;600;700) may have a reflective side coating (120;220;320;420;520;620;720) disposed on a sidewall (118;215;315;415,435;515) of a semiconductor light emitting device structure. Such a device may be fabricated by dicing a semiconductor structure to separate a semiconductor light emitting device structure and then forming a reflective side coating (120;220;320;420;520;620;720) on a sidewall (118;215;315;415,435;515) of the separated semiconductor light emitting device structure.

20 Claims, 3 Drawing Sheets (51) Int. Cl.
  *H01L 33/48* (2010.01)
  *H01L 33/50* (2010.01)
  *H01L 33/56* (2010.01)
(52) U.S. Cl.
  CPC .......... *H01L 33/486* (2013.01); *H01L 33/505* (2013.01); *H01L 33/56* (2013.01); *H01L 2933/0025* (2013.01); *H01L 2933/0058* (2013.01)

(56) References Cited

U.S. PATENT DOCUMENTS

| | | | |
|---|---|---|---|
| 2006/0033116 A1* | 2/2006 | Chae | H01L 21/28575 257/96 |
| 2011/0031520 A1* | 2/2011 | Mizuno | H01L 33/505 257/98 |
| 2011/0049545 A1 | 3/2011 | Basin et al. | |
| 2011/0175117 A1* | 7/2011 | Jagt | H01L 33/44 257/88 |
| 2012/0305061 A1 | 12/2012 | O'Brien et al. | |
| 2012/0305957 A1 | 12/2012 | Gahdhi et al. | |
| 2013/0265759 A1* | 10/2013 | Chen | F21V 7/10 362/235 |
| 2014/0054638 A1* | 2/2014 | Lester | H01L 33/0079 257/98 |
| 2014/0367717 A1 | 12/2014 | Freund et al. | |
| 2015/0034963 A1 | 2/2015 | Kinouchi et al. | |
| 2016/0240735 A1* | 8/2016 | Moran | H01L 33/20 |

FOREIGN PATENT DOCUMENTS

| | | |
|---|---|---|
| JP | 2007080994 A | 3/2007 |
| JP | 2008-277592 | 11/2008 |
| JP | 2012503876 A | 2/2012 |
| JP | 2014090052 A | 5/2014 |
| JP | 2015119063 A | 6/2015 |
| TW | 201501366 A | 1/2015 |
| TW | 201501373 A | 1/2015 |
| WO | 2014/167455 A2 | 10/2014 |

* cited by examiner

SEMICONDUCTOR LIGHT EMITTING DEVICE WITH REFLECTIVE SIDE COATING

CROSS REFERENCE TO RELATED APPLICATIONS

The present application claims priority to U.S. Provisional Patent Application No. 62/200,490 titled, "LIGHT EMITTING DEVICE WITH A SIDE REFLECTOR", filed Aug. 3, 2015, which is hereby incorporated by reference in its entirety.

BACKGROUND

An ideal diffuse radiator by definition emits radiation with a Lambertian distribution, i.e., a distribution in which the emitted radiant or luminous intensity is proportional to the cosine of the angle between the direction to the observer and a vector perpendicular to the emission surface. Real light sources that at least approximately produce Lambertian illumination are often desired, but semiconductor light emitting devices such as light emitting diodes (LEDs) commonly produce radiation patterns that noticeably differ from Lambertian illumination. For example, a typical LED chip has a box shape and emits light from five faces, particularly a top face and four side faces, when the bottom face of the chip is attached to a substrate. The light emission from the side faces of these five-sided emitters typically cause the emitted radiation patterns to be wider, i.e., brighter at larger angles from the normal direction, than a Lambertian distribution. A one-sided semiconductor emitter, i.e., a device that emits light from just one surface, may produce illumination with an angular distribution close to or easily converted to a Lambertian radiation pattern.

SUMMARY

In accordance with an aspect of the invention, a one-sided emitter may be created from a five-sided emitter, e.g., a mounted six-face LED chip, without significantly increasing physical dimensions of the emitter. In some implementations, a thin-film reflective side coating may be applied to sidewalls of a semiconductor device such as an LED die, leaving an uncoated top or emitting face. The characteristics of the thin-film reflective coating or the sidewalls of the emitter may also be controlled according to a desired radiation pattern or luminance gain from the uncoated face. An array of semiconductor chips with reflecting thin-film coatings can be closely packed in a device package because applying the reflective coating does not significantly increase the size of each chip and because the reflective coatings reduce cross talk between neighboring chips in the array.

In one specific implementation, a structure includes a semiconductor light emitting device and a reflecting thin-film coating. The reflecting thin-film coating may particularly be disposed on a sidewall of a semiconductor light emitting device such as a LED die.

Another specific implementation is a method that includes: dicing a semiconductor structure to separate a semiconductor light emitting device, e.g., an LED die; and forming a reflecting thin-film coating on a sidewall of the semiconductor light emitting device.

BRIEF DESCRIPTION OF THE DRAWINGS

The drawings illustrate examples for the purpose of explanation and are not of the invention itself. Use of the same reference symbols in different figures indicates similar or identical items.

DETAILED DESCRIPTION

A one-sided emitter may be made from a six-face LED chip by mounting the LED chip in a reflector cups on a substrate or by mounting the LED chip on a substrate and applying diffusive reflective material, e.g., silicone with embedded TiOx particles, to the four side faces of the chip to form an external reflector around the chip. Such external reflectors may, however, be relatively large and may prevent close packing of LED dies in a package or lamp. In accordance with an aspect disclosed herein, reflective side coatings may be formed on individual emitters, particularly on the sidewalls of the emitters, and may contain one or more thin-film layers. The optical characteristics of the coatings and the shape of the sidewalls may further be chosen to control a radiation pattern emitted from a top surface of the devices. The reflective side coatings may allow close packing of light emitting devices in an array on a substrate of a package and may prevent undesirable crosstalk by preventing neighboring devices from absorbing emitted light.

Figure 1:
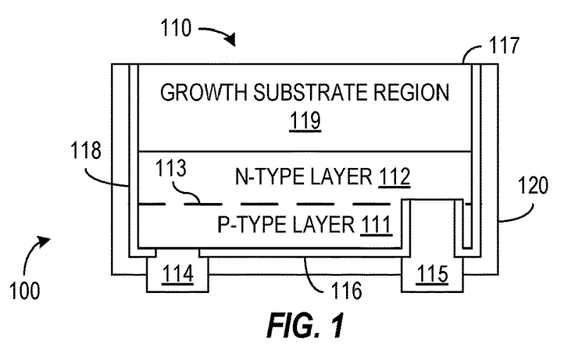
FIG. 1 shows a cross-sectional view of a one-sided emitter in accordance with an implementation having a reflecting thin-film coating on vertical sidewalls.

In some implementations, one or more sidewalls of an semiconductor light emitting device such as an LED die may be coated with reflective coating to create a one-sided emitter and to control the pattern of radiation emitted from the LED die. The sidewalls, e.g., the faces that are not parallel to the light-emitting layer in the LED die, may be perpendicular to the light emitting layer or may be sloped at an angle other than 90° with the light emitting layer. FIG. 1 illustrates an example of a semiconductor lighting device 100 including an LED chip or die 110 with sidewalls 118 perpendicular to major faces 116 and 117 of die 110. Die 110 may be of any desired construction, and FIG. 1 shows a simplified configuration in which die 110 is an LED die that includes a junction or active region 113 between layers 111 and 112 of P-type and N-type semiconductor materials. The illustrated implementation of die 110 is designed for flip-chip packaging and includes a bottom face 116 with electrical contacts 114 and 115 respectively connected to the P-type and N-type layers 111 and 112. As illustrated, die 110 may include a region 119 from a growth substrate, e.g., a substrate on which semiconductor layers were epitaxially grown, on a top face opposite from electrodes 114 and 115. Region 119, for example, may be a portion of a sapphire substrate that is transparent to wavelengths of light emitted from die 110 and therefore does not block emitted light. A die with alternative electrical structures, e.g., having a top or emitting face with conductive pads or contacts for wire bonding, could alternatively be employed and may not include a growth substrate region or may include a growth substrate region adjacent to the bottom face of the die.

During operation of semiconductor lighting device 100, P-N junction 113 may be forward bias to drive an electrical current between contacts 114 and 115 causing electrons and electron vacancies near the P-N junction 113 to combine and thereby produce photons or light. The resulting photons may thus originate near P-N junction 113 and may propagate in directions that depend on the specific construction of die 110. Device 100 includes a reflective side coating 120 on sidewalls 118 of LED die 110 to reflect at least some of the light that would otherwise escape through sidewalls 118. Reflective side coating 120 may further extend onto a bottom surface 116 of LED die 110, but coating 117 leaves electrodes 114 accessible for electrical connections. Reflective side coating 120 is also absent from or provides an opening on the top or emitting face 117 of die 110. As a result, device 100 is a one-sided emitter that does not emit the desired light through the coated sidewalls but may emit light from top face 117.

Reflective side coating 120 may be a single thin-film layer or may contain multiple thin-film layers. A thin film is generally a layer of material having at thickness ranging from fractions of a nanometer, e.g., a monolayer, to several micrometers in thickness. Reflective side coating 120 may particularly include a thin layer of a reflective material. For example, reflective side coating 120 may include a layer of reflective metal such as aluminum, silver, or gold, and an insulating layer may separate the reflective metal from conductive semiconductor regions. Alternatively, reflective side coating 120 may include multiple thin-film layers of dielectric materials with different refractive indices arranged to collectively reflect light of at least some of the wavelengths produced in die 110. In particular, reflective side coating 120 may form or include a Bragg reflector. In various alternative implementations, reflective side coating 120 may act as a partial reflector or a wavelength filter such as a low-pass, high-pass, or band-pass filter that reflects selected wavelengths of the emitted light and transmits or absorbs a significant percentage of other wavelengths of light. Alternatively, reflective side coating 120 may act as a full reflector that is reflective for substantially all of the wavelengths of light emitted in active region 113.

Figure 2:
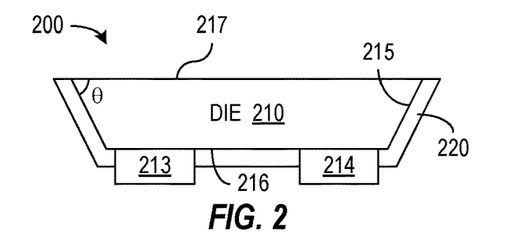
FIG. 2 shows a cross-sectional view of a one-sided emitter in accordance with an implementation having a reflecting thin-film coating on sidewalls that are sloped to provide an emitting top face that is larger than a bottom face of the emitter.

Die 110 may be a conventional six-face LED die that is cut from a wafer in a conventional manner to produce sidewalls 118 that are perpendicular to bottom face 116 and top face 117. A semiconductor light emitting device in some other implementations may have one or more sidewalls that are sloped at angles other than 90° with the light emitting face of the device. FIG. 2, for example, shows a semiconductor light emitting device 200 including a chip or die 210 with sidewalls 215 sloped so that a top or emitting face 217 of die 200 is larger than a bottom face 216 of die 210. Die 210 may, for example, be an LED die having substantially the same construction as the LED die 110 of FIG. 1, but one or more sidewalls 215 of die 210 are sloped. Sidewalls 215 may acquire a slope by cutting die 210 from a wafer using a dicing saw or other cutting instrument arranged to cut at a desired angle to the main surface of the wafer. Alternatively, sidewalls of die 210 may be polished or otherwise machined after dicing to define or control the slope of sidewalls 215. An angle θ of sloped sidewalls 215 with respect to emitting face 217 and the light emitting junction in die 210 may be between 15° and 85°, between 35° and 55°, or about 45° in some alternative configurations. More generally angle θ may be chosen according to the desired angular distribution of light emitted from top face 217.

Sidewalls 215 of die 210 have a reflective side coating 220 that may be similar or identical to reflective side coating 120, and reflective side coating 220 may optionally cover a portion of bottom face 216 of die 210 except areas of electrodes 213 and 214 that may be used for electrical connections of die 210. The optical characteristics of reflective side coating 220 may be chosen according to the wavelengths of light selected to be reflected, the selected angle θ of sidewalls 215, and the desired angular distribution of light emitted from face 217.

Figure 3:
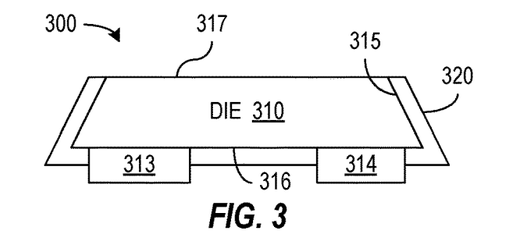
FIG. 3 shows a cross-sectional view of a one-sided emitter in accordance with an implementation having a reflecting thin-film coating on sidewalls that are sloped to provide an emitting top face that is smaller than a bottom face of the emitter.

FIG. 3 shows a semiconductor lighting device 300 in accordance with yet another implementation. Device 300 includes a semiconductor chip or die 310 with a top or emitting surface 317 that is smaller than the bottom surface 316 of die 310. Device 300 has a reflective side coating 320 that covers one or more of sidewalls 315, optionally covers a portion of bottom face 316, and leaves all or some portion of top emitting face 317 uncovered for emission of light. Semiconductor lighting device 310 may otherwise similar or identical to device 200 of FIG. 2.

Figure 4A:
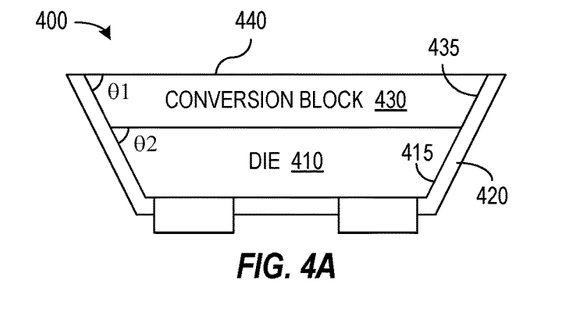
FIG. 4A shows a cross-sectional view of a one-sided emitter in accordance with an implementation having a reflecting thin-film coating on sidewalls of an emitter including a light emitting die and a light conversion block on the light emitting die.

A one-sided emitter in some other implementations may further coat a reflective layer on a secondary material block disposed proximate a semiconductor light source. For example, FIG. 4A shows a semiconductor lighting device 400 that produces white light using a light-emitting semiconductor chip or die 410, e.g., an LED die that emits blue light, and a block 430 of a wavelength converting material attached to the top surface of die 410. Block 430 may, for example, be a phosphor such as a yttrium aluminum garnet (YAG) phosphor attached to a top face of semiconductor die 410. In operation, light emitted from die 410 may enter block 430 and excite the wavelength converting material in block 430, so that block 430 fluoresces to produce a broader spectrum of light. To control the angular pattern of radiation emitted from the combined system including die 410 and block 430, semiconductor lighting device 400 has a reflective side coating 420 on sidewalls 415 and 435 of die 410 and block 430. Reflective side coating 420 may otherwise be similar or identical to reflective side coatings 120, 220, and 320 described above.

The sidewalls 415 of die 410 are not required to be parallel to the sidewalls 436 of conversion block 430. Sidewall 435 may be at any angle θ1 with emitting face 440, and sidewall 415 may be at any angle θ2 with emitting face 440. In one configuration, angles θ1 and θ2 are both equal to 90° so that sidewalls 415 and 435 are perpendicular to emitting face 440 for a structure similar to that shown in FIG. 1. In another configuration, angles θ1 and θ2 may be the same and may be less than 90° so that emitting face 440 is larger than the bottom face of device 400, for a structure similar to that shown in FIG. 2. In still another configuration, angles θ1 and θ2 may be the same and may be greater than 90° so that emitting face 440 is smaller than the bottom face of device 400, for a structure similar to that shown in FIG. 3. More generally, angles θ1 and θ2 may differ and may be selected so that light emitted from die 410 and converted in or passing through block 430 has a desired angular distribution.

Figure 4B:
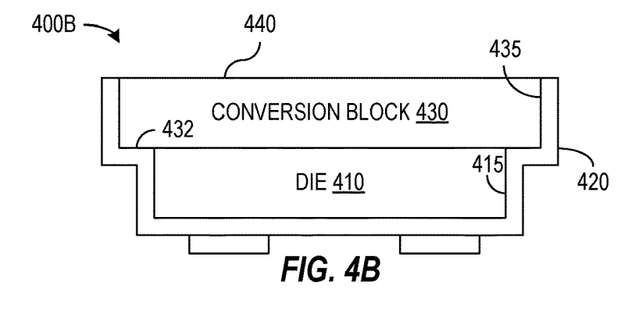
FIGS. 4B and 4C show cross-sectional views of a one-sided emitter in accordance with implementations having reflecting thin-film coatings on emitters including dies that may be bigger or smaller than the attached light conversion blocks.
Figure 4C:
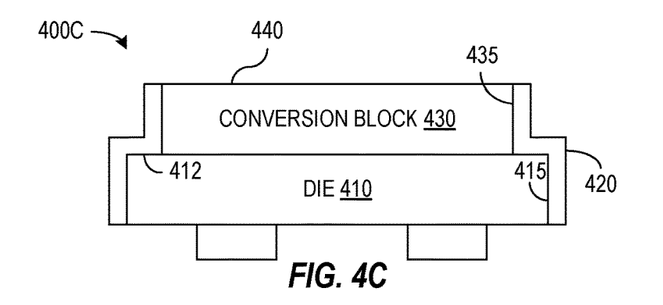

Conversion block 430, in addition to having sides at an angle θ1 that may differ from the sidewall angle θ2 of die 410, may differ in size from die 410. FIG. 4B, for example, illustrates a semiconductor light emitting device 400B in which conversion block 430 is larger than die 410, and FIG. 4C illustrates a semiconductor light emitting device 400C in which conversion block 430 is smaller than die 410. When die 410 and conversion block 430 differ in size, reflective coating 420 needs to cover not only sidewall 415 and 435 of die 410 and sidewall 435 of conversion block 430 but also horizontal areas associated with an overhang 432 or a step 412 resulting from the size difference between conversion block 430 and die 410. As described further below, reflective side coating 420 may be formed using isotropic deposition techniques to cover not only sidewalls 415 and 435 but also overhangs 432 or steps 412.

Figure 5:
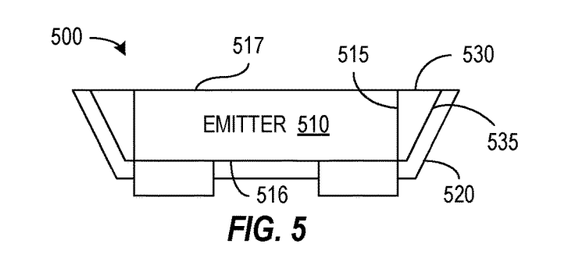
FIG. 5 shows a cross-sectional view of a one-sided emitter in accordance with an implementation including an emitter, surrounding filler material that provides sloped sidewalls, and a reflecting thin-film coating on the sloped sidewalls.

Inclined or sloped sidewalls may be formed on a die as a part of a dicing process or may alternatively be formed on any emitter, e.g., on an emitter including a die and light conversion block, through a separate process after dicing. FIG. 5 shows a semiconductor light emitting device 500 in which sloped sidewalls are formed on a region or layer 530 of transparent material deposited on sidewalls 515 of an integrated emitter 510. Emitter 510 may include a semiconductor chip or die, e.g., an LED die, with or without additional integrated structure such a phosphor or converter block attached to the die. Emitter 510 may particularly be either a blue or a white light emitting device. Transparent layer 530 may, for example, be formed on emitter 510 using line-of-sight deposition methods and/or masking and etching to provide sloped sidewalls 535. In particular, deposition techniques such as sputtering generally requires selection of a proper gas pressure in a chamber in order to deposit a uniform layer. Using a lower pressure in such reaction chambers tends to cause preferential deposition toward the top of sidewalls, so that controlled deposition of layer 530 may create a sloped sidewall surface 535 if a low reaction chamber pressure is used. A reflective side coating 520 may then be formed on sloped sidewalls 535 of emitter 510. The slope or shape of sidewalls 535 may be controlled or selected to manipulate the emitted light, for example, to modify the emitted radiation pattern and improve energy efficiency of semiconductor light emitting device 500.

Figure 6:
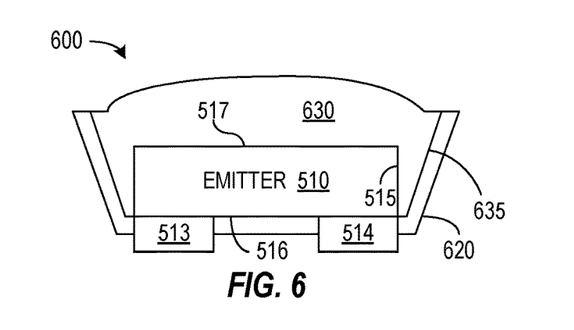
FIG. 6 shows a cross-sectional view of a one-sided emitter in accordance with an implementation including an emitter, filler material shaped to perform an optical function, and a reflecting thin-film coating on the sidewalls of the emitter.

In some implementations, a transparent layer added to an emitter structure, which may or may not be used to form sloped sidewalls, may further cover the top or emitting face of the emitter, and the transparent material may be shaped to create light extraction features. FIG. 6 shows a semiconductor light device 600 including an emitter 510 having side surfaces 515 and a top surface 517 covered with a layer 630 of transparent material. In one implementation, emitter 510 is an LED die, and layer 630 may be deposited on a remnant of a sapphire growth substrate on which LED die 510 was manufactured. In this case, the top face 517 of emitter 510 may be a surface of a transparent growth substrate material, e.g., sapphire. The transparent growth substrate material of emitter 510 may be preconditioned or patterned to achieve a desired optical effect or function before layer 630 is deposited. Layer 630 may be created or altered through a deposition process or selective patterning of transparent layer 630 to create an optical structure or extraction feature. Accordingly, desired optical properties of the emitting side of device 600 may achieved through processing of the top surfaces of both emitter 510 and transparent layer 630. In particular, the top surface of emitter 510 of transparent layer 630 may be shaped to increase or decrease divergence of emitted light. The top surface of emitter 510 or layer 630 may also be textured by, for example, etching to remove material and create features that scatter or diffuse emitted light.

Optical characteristics of transparent material 630 may be controlled or altered not only by controlling the surface shape of material 630 but also through control of the refractive index of material 630. For example, layer 630 may be silicone or glass formed using a sol gel process that varies the refractive index of material 630, and the pattern of the variation of the refractive index of layer 630 (or layer 530 of FIG. 5) can achieve a desired optical function. In particular, emitter 510 may have a preferred direction for light emission that differs from a desired direction for emission or for incidence on optical coating 520 or 620. For example, coating 520 or 620 may be a distributed Bragg reflector (DBR) that is more effected at reflecting of the desired wavelengths if the light is incident on coating 520 or 620 at particular angles. Spatial variation of the refractive index of material 530 or 630 may be used to redirect light emitted from emitter 510 to desired directions either for reflection from side coating 520 or 620 or for emission from device 500 or 600.

Figure 7:
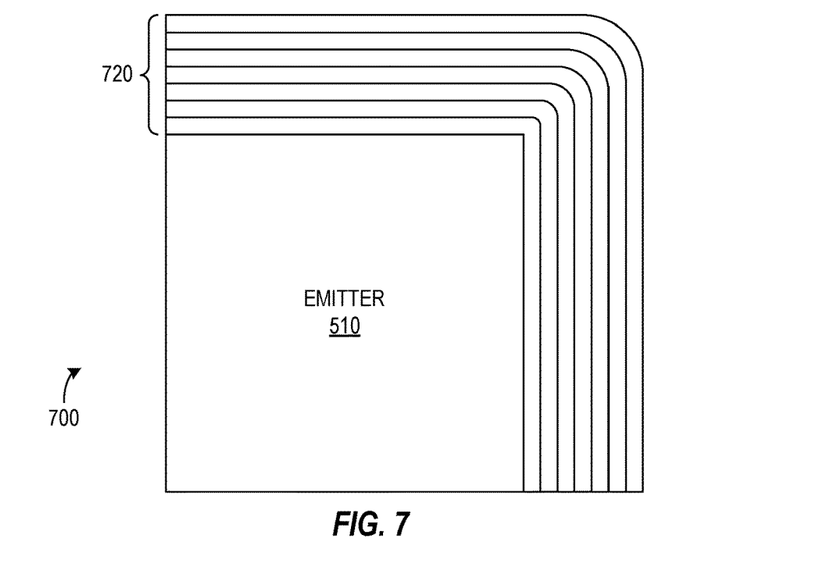
FIG. 7 shows a top view of a portion of an emitter in accordance with an implementation a reflecting thin-film coating that includes multiple thin-film layers.

The reflective side coatings described above may be implemented in many different ways. FIG. 7 shows a top view of a device 700 including an emitter 510 and a multi-layer reflective side coating 720. Emitter 510 as described above may be a die, e.g., an LED die, or may include further structure such as an attached light conversion block. Reflective coating 720 is a stack of multiple thin-film layers that may be of the same or different thicknesses and may contain the same or different materials. In general, reflective side coating 720 may include at least two layers in some embodiments, no more than 80 layers in some other embodiments, at least 20 layers in some embodiments, no more than 50 layers in some embodiments, and about 40 layers in some embodiments. Each thin-film layer in multi-layer reflective side coating 720 may be at least 100 nm thick in some embodiments, no more than 10 microns thick in some embodiments, at least 500 nm thick in some embodiments, and no more than 2 microns thick in some embodiments. The total thickness of multi-layer reflective side coating 720 may be at least 1 micron in some embodiments, no more than 50 microns in some embodiments, at least 5 microns in some embodiments, and no more than 25 microns in some embodiments. In some embodiments, multi-layer reflective coating 720 may provide a reflectivity up to about 99% for light having some or all of the wavelengths emitted from emitter 510.

Examples of some suitable materials used to form reflective side coating 720 include: metals such as silver (Ag), gold (Au), aluminum (Al), nickel (Ni), platinum (Pt), and palladium (Pd); metal-oxides such as $TiO_2$, $Al_2O_3$, $Nb_2O_5$, HfO$_2$, and ZrO, metal-nitrides such as TiN$_x$ and AlN, other dielectric materials such as SiO$_2$ or SiN$_x$; and combinations thereof. In some embodiments, reflective side coating 720 is or includes a distributed Bragg reflector. In some embodiments, reflective side coating 720 includes a stack of layers that alternate high index of refraction layers and low index of refraction layers. In some embodiments, reflective side coating 720 is a multi-layer stack including repeating groups of two, three, or more layers.

In some embodiments, reflective side coating 720 may include one or more layer of a porous material, such as a porous metal-oxide material or a porous glass. Such material may be made porous, i.e., containing gas or air pockets, in order to manipulate the index of refraction of the material. The index of refraction of a porous material is typically less than the index of refraction of the bulk material. Porous materials may be formed by, for example, any suitable process including a zero gel process or a pulsed laser deposit. In some embodiments, the porosity (and therefore, the index of refraction) of a layer in reflective side coating 720 may be graded.

In some embodiments, the reflective side coatings described above may be formed on surfaces of the LED die and/or on surfaces of secondary material blocks by thin-film deposition methods such as, for example, sputtering deposition, atomic layer deposition (ALD), and vacuum evaporation or by liquid-solid phase techniques, such as, for example, a sol-gel method.

Figure 8:
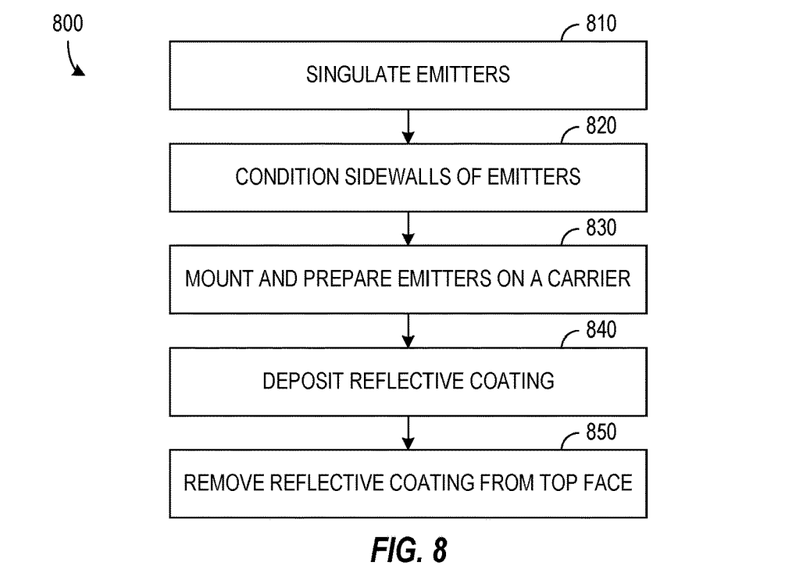
FIG. 8 is a flow diagram of one implementation of a process for making a semiconductor light emitting device having sidewalls covered with a reflecting thin-film coating.

FIG. 8 is a flow diagram of one example of process 800 for forming one-sided emitters in accordance with some of the embodiments of the invention as described above. Process 800 may begin with dicing or singulating emitters, e.g., cutting LED dice from a wafer on which LEDs were formed. After dicing process 810, each emitter may include a portion of a growth substrate, e.g., a sapphire substrate, on which the LEDs were fabricated. As noted above, dicing process 810 may leave each emitter with sidewalls that are perpendicular to the top surface or at an angle other than 90° with the top surface. In some embodiments, process 810 may include attaching light converter blocks or phosphors to the separated dice, e.g., so that each emitter includes an LED die and a phosphor.

The surfaces of the emitters, e.g., the sidewalls of the LED dice, to be covered with the reflective side coating may be conditioned in step 820 prior to formation of the reflective coating. Such conditioning may, for example, improve the characteristics of each emitter to enhance the effects of the reflective coating. In one case, after dicing, the sidewalls of LED dice are typically marked by roughness often having features on the order of half a micron in size. Conditioning 820 may include smoothing physical features formed on the sidewalls, e.g., smoothing roughness of the sapphire growth substrate resulting from stealth dicing or other die separation techniques. Conditioning 820 may particularly apply plasma dry-etching, liquid-solid phase coating, or mechanical polishing to form smooth sidewalls on each emitter. After conditioning process 820, the sidewalls of the growth substrate and/or the semiconductor structure of each LED die may have features no more than 100 nm in size in some embodiments, no more than 50 nm in size in some embodiments, and at least 1 nm in size in some embodiments. Conditioning 820 may further include using a solvent and/or plasma cleaning to clean the sidewalls of the separate emitters.

Conditioning process 820 may further include depositing material to provide smooth or sloped sidewalls on the emitter or to provide a layer with a graded refractive index, e.g., by increasing or decreasing porosity to achieve a desired optical effect or function. In particular, the variation in the refractive index of added material may be chosen according to the characteristics of the reflective coating to be formed in a deposition process 840.

A process 830 mounts the conditioned emitters on a carrier for deposition process 840. For example, process 830 may attach bottoms sides of LED dice to a carrier using a thin layer of adhesive or a double-sided tape before the carrier is introduced to a deposition chamber. Process 830 may particularly attach emitters with contact pads down to the carrier and a top surfaces of the emitters exposed. For removal of reflecting materials that may be deposited on the top (emitting) face of the LED dice, process 830 may also cover the emitting faces of the emitters with a sacrificial material, e.g., photoresist, adhesive tape, or similar masking material, that can be removed after a deposition process 840. Alternatively, applying a layer of sacrificial material to the top surfaces of the emitters may be skipped in preparation process 830.

Process 840 deposits or forms the reflective coating on the sidewalls of the emitters while the emitters are mounted on the carrier. To deposit multiple layers of materials on emitters, common thin-film deposition techniques such as vacuum evaporation, sputtering deposition, or atomic layer deposition may be employed to isotropically deposit layers of material on all exposed sides of the emitters. Accordingly, reflective coating may be formed on a top or emitting surface of the emitters. A process 850 removes the reflective coating from the top surfaces of the emitters. If a sacrificial material was used in process 830, process 850 may remove the sacrificial material to take the overlying reflective materials away from the top face. If process 830 does not apply a sacrificial layer, process 850 can selectively remove deposited reflecting materials on the top face of the emitters using a process such as mechanical lapping or anisotropic dry etching.

Figure 9:
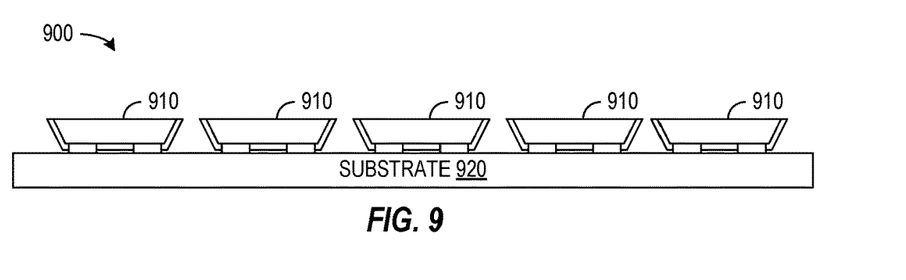
FIG. 9 is a cross-section view of a lighting package containing an array of semiconductor light emitting devices having sidewalls covered with reflecting thin-film coatings.

The embodiments described above may replace the existing LED dies in many existing products or packaging due to the fact that the physical dimensions of emitters with reflective side coatings are practically the same as the physical dimensions of the emitters without the reflective coating. FIG. 9, for example, illustrates an embodiment of a lighting package 900 including an array of emitters 910 that are flip-chip mounted on and electrically connected to a package substrate 920. Each emitter 910 includes a reflective side coating and may employ any of the configurations disclosed herein. Since the reflective side coatings on emitters 910 direct light from each emitter away from neighboring emitters 910, emitters 910 may be closely packed in the array and still provided minimal cross-talk in a close-packed array. In some embodiments, the light emitting regions of neighboring LEDs are spaced no more than 100 microns apart in some embodiments, and no more than 50 microns apart in some embodiments. Further, the thin-film side reflectors on emitters 910 have negligible volume compared to the volumetric diffusive reflectors. Accordingly, emitters 910 may be physically small, meaning that the array and lighting package 900 may be physically small.

Embodiments lighting devices disclosed herein may have advantages over prior lighting systems. In particular, some embodiments provide one-sided emitters that provide radiation patterns that may be close to a Lambertian pattern. In particular, five-sided emitters tend to have wider radiation patterns than the Lambertian. By controlling the characteristics of thin-film side reflectors, the radiation pattern from an emitter can be controlled.

Emitters with thin-film reflective side coatings as disclosed herein may also provide high energy efficiency when compare to other emitters producing nearly Lambertian light distributions. For example, if volumetric diffusive side reflectors, e.g. $TiO_x$ particles in silicone binder, are used to create a one-sided emitter, the luminance of the emitter tends to decrease at least because of the increased source size that results from emitted light penetrating into the diffusive reflector body. Implementation of a thin-film side reflector does not cause a significant increase of source size, and thus may not cause a decrease of luminance. Further, restricting emitted light to exiting at the top surface by forming a thin film reflective side coating does not significantly reduce energy efficiency since reflected light is not required to traverse a significant thickness of light absorbing material.

Reflective side coatings may also improve the tolerance that emitters have for handling, e.g., during packaging or deployment. In some embodiments of emitters, a coated die may not require silicone-based encapsulation, which may lead to easier customer handling, higher reliability and lower stress on the die.

Having described the specific implementations in detail herein, those skilled in the art will appreciate that, given the present disclosure, modifications may be made to those implementations without departing from the spirit of the inventive concepts described herein. In particular, different features and components of the different devices described herein may be used in any of the other devices, or features and components may be omitted from any of the devices. Therefore, it is not intended that the scope of the invention be limited to the specific embodiments illustrated and described.

What is being claimed is:

1. A light emitting structure comprising:
   a semiconductor light emitting device having a top emitting surface connected to an opposite bottom surface by sloped sidewalls that are at a non-perpendicular angle with respect to the top emitting surface;
   a reflecting thin-film coating disposed in direct contact with and conforming to the sloped sidewalls of the semiconductor light emitting device, the reflecting thin-film coating having a thickness that is at least 1 micron and no greater than 50 microns.

2. The light emitting structure of claim 1, the reflecting thin-film coating including at least 20 layers and no more than 80 layers.

3. The light emitting structure of claim 1, the semiconductor light emitting device including a growth substrate and a light emitting diode (LED) that is formed on the growth substrate, and the reflecting thin-film coating covering one or more sides of the growth substrate while leaving a top surface of the growth substrate exposed.

4. The light emitting structure of claim 1, the reflecting thin-film coating comprising a plurality of layers arranged to form a Bragg reflector, each layer of the plurality of layers having a same thickness between 100 nm and 10 microns.

5. The light emitting structure of claim 1, the reflecting thin-film coating being disposed in direct contact with at least part of the opposite bottom surface of the semiconductor light emitting device.

6. The light emitting structure of claim 1, further comprising a wavelength converting layer disposed on the top emitting surface of the semiconductor light emitting device and comprising second sloped sidewalls, the reflecting thin-film coating disposed on and in direct contact with second sloped sidewalls of the wavelength converting element.

7. The light emitting structure of claim 1, the semiconductor light emitting device comprising:
   a die; and
   a transparent layer in direct contact with and on a side of the die and conforming and in direct contact with the sloped sidewalls on which the thin-film reflective coating is disposed.

8. The light emitting structure of claim 7, the transparent layer including a porous material having a refractive index that varies to perform an optical function on light emitted from the die.

9. The light emitting structure of claim 7, the transparent layer having a variable thickness along a direction perpendicular to the top emitting surface of the semiconductor light emitting device.

10. A light emitting structure comprising:
    a semiconductor light emitting device comprising:
    a die with a first top emitting surface connected to an opposite first bottom surface by first sidewalls;
    a wavelength conversion layer having a second top emitting surface connected to an opposite second bottom surface by second sidewalls, the opposite second bottom surface disposed on and in direct contact with the first top emitting surface of the die, the second top emitting surface having a different area than the first top emitting surface of the die;
    a reflecting thin-film coating disposed in direct contact with and conforming to the first sidewalls of the die and the second sidewalls of the wavelength conversion layer, the reflecting thin-film coating having a thickness that is at least 1 micron and no greater than 50 microns.

11. A method comprising:
    dicing a semiconductor structure to form a plurality of semiconductor light emitting devices, each of the semiconductor light emitting devices respectively including a sidewall; and
    forming, on each of the semiconductor light emitting devices, a reflecting thin-film coating on and in direct contact with the sidewall of the semiconductor light emitting device, the reflecting thin-film coating having a thickness that is at least 1 micron and no greater than 50 microns.

12. The method of claim 11, wherein the reflecting thin-film coating includes at least 20 layers and no more than 80 layers.

13. The method of claim 11, the forming the thin-film coating comprising forming by atomic layer deposition.

14. The method of claim 11, further comprising forming the semiconductor light emitting device by forming a light emitting diode (LED) on a growth substrate, the reflecting thin-film coating being formed to cover one or more sides of the growth substrate while leaving a top surface of the growth substrate exposed.

15. The method of claim 11, further comprising prior to said forming, depositing a transparent material such that the transparent material forms the sidewall, the sidewall forming an angle with a light emitting layer of the semiconductor light emitting device less than 90°.

16. The method of claim 11, further comprising texturing a top surface of the semiconductor light emitting device.

17. The method of claim 11, the reflecting thin-film coating operating as partial reflector.

18. The method of claim 11, the reflecting thin-film coating comprising a plurality of layers arranged to form a Bragg reflector, each layer of the plurality of layers having a same thickness between 100 nm and 10 microns.

19. The method of claim 11, further comprising forming, in the reflecting thin-film coating, a layer of porous material.

20. The light emitting device according to claim 1, wherein the top emitting surface of the semiconductor light emitting device is flush with the reflecting thin-film coating at all edges of the semiconductor light emitting device.

* * * * *